United States Patent [19]

Jones

[11] Patent Number: 5,394,304
[45] Date of Patent: Feb. 28, 1995

[54] SHIELDED SELF-MOLDING PACKAGE FOR AN ELECTRONIC COMPONENT

[75] Inventor: Allen M. Jones, Novi, Mich.

[73] Assignee: Williams International Corporation, Walled Lake, Mich.

[21] Appl. No.: 87,661

[22] Filed: Jul. 6, 1993

Related U.S. Application Data

[62] Division of Ser. No. 957,596, Oct. 6, 1992.

[51] Int. Cl.⁶ .............................................. H05K 1/16
[52] U.S. Cl. ................... 361/765; 361/748; 361/761; 361/771; 361/816; 174/256; 174/35 R; 257/787
[58] Field of Search ............... 361/738, 748, 750–752, 361/761–763, 770, 771, 816, 818; 174/35 R, 52.2, 52.1, 255, 256; 257/700, 787–790

[56] References Cited

U.S. PATENT DOCUMENTS 5,166,864  11/1992  Chitwood et al. ................. 361/386

FOREIGN PATENT DOCUMENTS 278299A   3/1990  Japan .
3276799  12/1991  Japan .

*Primary Examiner*—Leo P. Picard
*Assistant Examiner*—Young Whang
*Attorney, Agent, or Firm*—Lyman R. Lyon

[57] ABSTRACT

An electromagnetically shielded self-molding package for an electronic component comprises a pair of bags having an electrically conductive coating therebetween and disposed about the component and having a polymerizable resin completely filling the space between the bags and the component.

1 Claim, 1 Drawing Sheet

SHIELDED SELF-MOLDING PACKAGE FOR AN ELECTRONIC COMPONENT

This is a divisional of copending application(s) Ser. No. 07 957,596 filed on Oct. 6, 1992.

BACKGROUND OF THE INVENTION

Known methods of packaging electronic components generally entail enclosing the component in a specially designed container or encapsulating the components in a rigid media through dipping or molding. Such high integrity packaging of electronic components, sometimes termed "potting," often amounts to a disproportionate share of the weight and cost of the electronic component assembly. Such known methods have inherent disadvantages, particularly when electrical shielding is required. Moreover, installation of the "potted" components generally requires a relatively large volume allocation.

This situation is ameliorated to some extent by the use of molded packaging. However, molding requires time intensive steps for dipping or other application operations. In the case of electronic components that require grounded shielding for the suppression of electromagnetic interference, a second coating must be applied to the outer surface of the molded assembly. Since the vital outer coating must be protected against damage, additional processing is generally required to insure the integrity of the shielding.

SUMMARY OF THE INVENTION

The aforesaid problem is solved by a self tooling, multilayered thermoplastic "shrink wrap" enclosure that is filled with a prescribed amount of an injectable low viscosity thermoset resin. Precalculated shrink of the thermoplastic wrap over a measured amount of thermoset resin results, when the assembly is heated for shrink and cure, in minimum material usage and in a light weight, self tooled, rigid assembly. The resulting cured shape of the molded self tooled assembly will be largely determined by the shape of the electronic components or mounting therefor. As the wrapping is exposed to heat and shrinks, it will bridge the high points of the assembly's components. The final cured shape need not be governed or altered by subsequent tooling or processing. Conductive shielding around the electronic components is provided between layers of the shrink wrap. When heat shrink and cure of the assembly is completed, the conductive shielding is reliably sealed internally of the outer plastic coating.

DETAILED DESCRIPTION OF THE PREFERRED EMBODIMENT OF THE INVENTION

Figure 1:
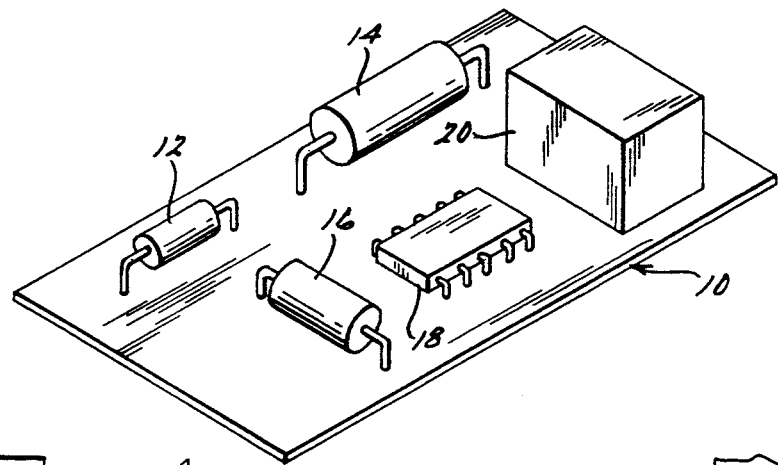
FIG. 1 is a perspective view of a circuit board having a plurality of electronic components mounted thereon.
Figure 2:
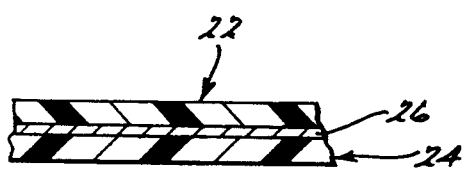
FIG. 2 is a perspective view of the circuit board of FIG. 1 enclosed within a plurality of thermoplastic layers with a resin injection nozzle extending thereinto.

As seen in FIG. 1 of the drawing, a circuit board 10 is provided with a plurality of electronic components 12, 14, 16, 18 and 20 which are secured to the board 10 in the conventional manner.

Figure 4:
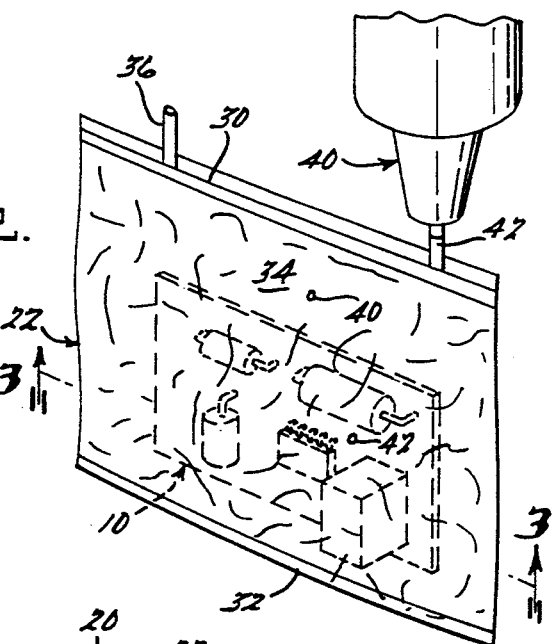
FIG. 4 is a cross-sectional view taken substantially along the line 4—4 of FIG. 3.
Figure 3:
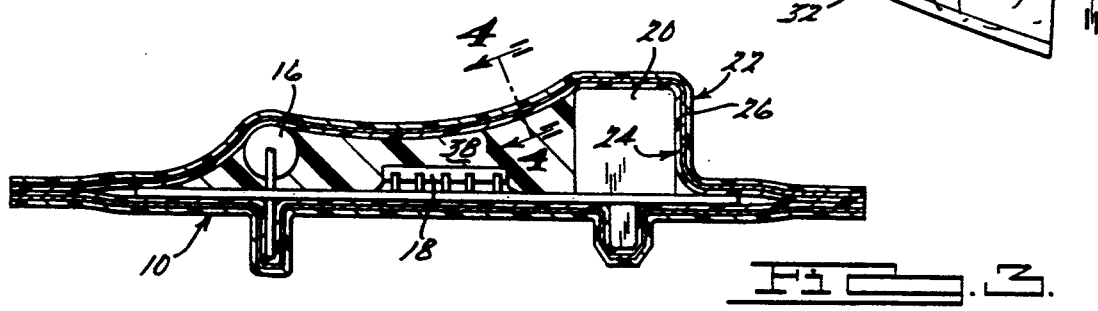
FIG. 3 is a cross-sectional view taken along the line 3—3 of FIG. 2 after heat shrink of the enclosure and cure of the thermoplastic resin therein.

In accordance with a preferred constructed embodiment of the instant invention, the circuit board 10 is enclosed in a pair of plastic bags 22 and 24. It is to be understood that the number of bags employed is dependent upon the characteristics of the electronic components and whether the components are required to be electrically shielded from electromagnetic interference. As seen in FIG. 4, the outer bag 22 encloses the internal bag 24, which is provided with an electrically conductive metallic layer 26 suitable for shielding the components 12, 14, 16, 18 and 20 of the circuit board 10.

The bags 22 and 24 may be formed as tubes and thereafter heat sealed along edges 30 and 32 thereof to form an enclosure 34. The enclosure 34 is provided with an air bleed sprue 36 to provide for the exhaust of air trapped internally of the enclosure 34 upon the injection of resin 38 thereinto as well as to provide for exit of air from the inside of the enclosure 34 upon shrink of the plastic bags 22 and 24. Resin is injected through a resin injector tube 42.

Figure 5:
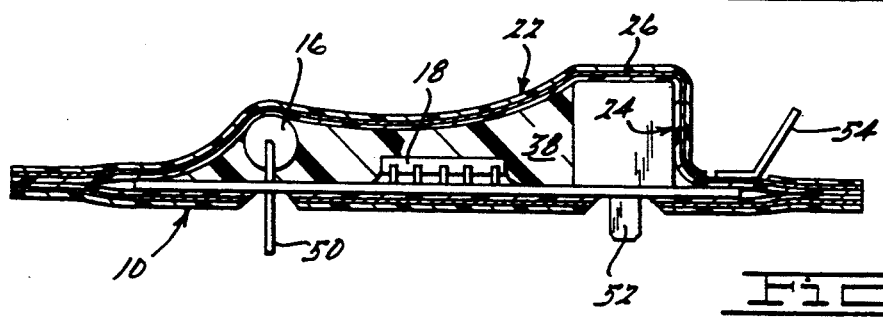
FIG. 5 is a view similar to FIG. 3 of the completed shrink wrap package.

As best seen in FIG. 5 of the drawing, the portion of the plastic bags 22 and 24 surrounding a pair of terminals 50 and 52 extending from the components 16 and 20 are ground away exposing the terminals 50 and 52 for electrical connection to an electrical circuit. The shielding layer 24 is provided with a ground terminal as may be required.

While the preferred embodiment of the invention has been disclosed, it should be appreciated that the invention is susceptible of modification without departing from the scope of the following claims.

I claim:

1. An electromagnetically shielded package for an electronic component comprising:
   a first thermoplastic heat shrinkable bag disposed about said electronic component;
   a second thermoplastic heat shrinkable bag disposed about said first bag;
   an electrically conductive coating on one of said bags and disposed between said bags; and
   a polymerizable resin completely filling the space between said electronic component and the interior of said first bag.

* * * * *